United States Patent
Kurusu

(10) Patent No.: US 11,949,411 B2
(45) Date of Patent: Apr. 2, 2024

(54) SEMICONDUCTOR DEVICE

(71) Applicant: Mitsubishi Electric Corporation, Tokyo (JP)

(72) Inventor: Hitoshi Kurusu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/776,698

(22) PCT Filed: Mar. 19, 2020

(86) PCT No.: PCT/JP2020/012411
§ 371 (c)(1),
(2) Date: May 13, 2022

(87) PCT Pub. No.: WO2021/186694
PCT Pub. Date: Sep. 23, 2021

(65) Prior Publication Data
US 2022/0385286 A1 Dec. 1, 2022

(51) Int. Cl.
*H03K 17/687* (2006.01)
*H03F 1/52* (2006.01)
*H03F 3/193* (2006.01)

(52) U.S. Cl.
CPC .............. *H03K 17/687* (2013.01); *H03F 1/52* (2013.01); *H03F 3/193* (2013.01); *H03F 2200/294* (2013.01); *H03F 2200/372* (2013.01)

(58) Field of Classification Search
None
See application file for complete search history.

(56) References Cited

U.S. PATENT DOCUMENTS 5,892,400 A * 4/1999 van Saders ............ H03K 3/354
330/296
6,144,259 A 11/2000 Kirisawa
(Continued)

FOREIGN PATENT DOCUMENTS

JP S62-007218 A 1/1987
JP H10-051244 A 2/1998
(Continued)

OTHER PUBLICATIONS

International Search Report issued in PCT/JP2020/012411; dated Jun. 9, 2020.
(Continued)

*Primary Examiner* — Kenneth B Wells
(74) *Attorney, Agent, or Firm* — Studebaker & Brackett PC

(57) ABSTRACT

A semiconductor device (1) according to the present disclosure includes: an n-channel depletion-mode transistor (10); an input matching circuit inside which the gate terminal (11) and the ground terminal (22) are DC-connected; a self-bias circuit (26) including a resistor (14) biasing the transistor (10) by a voltage drop due to a current flowing through the resistor (14), and a capacitor (15) connected in parallel to the resistor 14 and regarded as short-circuit at a frequency of the high-frequency power; and a diode (31) having an endmost anode connected to the source terminal (12) and an endmost cathode connected to the ground terminal (22), and connected in one stage or connected in series in a plurality of stages in the same direction.

15 Claims, 6 Drawing Sheets

(56) References Cited

U.S. PATENT DOCUMENTS 10,270,406 B2 * 4/2019 Nishimori ............... H01L 23/66
2018/0041177 A1 2/2018 Nishimori et al.

FOREIGN PATENT DOCUMENTS

| | | |
|---|---|---|
| JP | 3107035 B2 | 11/2000 |
| JP | 2005-26972 A | 1/2005 |
| JP | 2013-211666 A | 10/2013 |
| JP | 2018-23043 A | 2/2018 |

OTHER PUBLICATIONS

An Office Action; "Notice of Reasons for Refusal," mailed by the Japanese Patent Office dated Aug. 16, 2023, which corresponds to Japanese Patent Application No. 2022-507981 and is related to U.S. Appl. No. 17/776,698; with English language translation.

An Office Action; "Notice of Reasons for Refusal," mailed by the Japanese Patent Office dated Apr. 4, 2023, which corresponds to Japanese Patent Application No. 2022-507981 and is related to U.S. Appl. No. 17/776,698; with English language translation.

* cited by examiner

SEMICONDUCTOR DEVICE

FIELD

The present disclosure relates to a semiconductor device used at a high frequency.

BACKGROUND

A field-effect transistor that operates at a high frequency equal to or higher than a frequency of a microwave and includes gallium arsenide (GaAs), or the like, as a chief material, is typically of a depletion mode, in which application of a negative voltage to a gate terminal is required to control a drain current.

On the other hand, there is a method that eliminates the need of a negative voltage to control a drain current by using a self-bias circuit. For example, JP H10–51244 A discloses an amplifier having a single power supply including a depletion-mode field-effect transistor. Here, a gate terminal is connected to a ground terminal of an amplifier circuit so that a potential of the gate terminal becomes equal to a reference potential of the amplifier circuit, a resistor is connected between a source terminal and the ground terminal, and a drain current is adjusted by means of a voltage drop at the resistor caused by the drain current. Thus, the amplifier including a self-bias circuit operates only by application of a positive voltage to a drain terminal without the need of a negative voltage.

CITATION LIST

Patent Literature

[PTL 1] JP H10–51244 A

SUMMARY

Technical Problem

A transistor that operates at a high frequency has an extremely fine structure. Thus, the transistor is extremely vulnerable to excessive input.

In a case where high-frequency power is excessively input to an amplifier including a self-bias circuit, not only an amplitude of a potential at a gate terminal increases, but also an amplitude of a potential at a source terminal increases due to a voltage drop at a resistor of the self-bias circuit.

Typically, a gate structure of a field-effect transistor including GaAs, or the like, as a chief material has a Schottky junction. In a case where a forward voltage between a gate and a source of the transistor rises, it is considered that a gate current exponentially increases in accordance with the gate voltage, which leads to breakage of the gate.

On the other hand, withstand voltage breakage also occurs in a reverse direction of the Schottky junction. At the self-bias circuit, a potential difference in the reverse direction between the gate and the source of the transistor increases in an excessive input state due to influence of a resistor existing at a source terminal. Breakage occurs due to rise in a voltage in the reverse direction as well as the forward current.

Typically, input power that a transistor can withstand is proportional to a size of the transistor. However, increasing the size of the transistor to address excessive input is not a favorable option because increasing the size of the transistor negatively affects high-frequency characteristics of an amplifier circuit and increases current consumption in a case of an amplifier including a self-bias circuit.

On the other hand, there is a method in which a protective circuit is inserted into an input unit. However, insertion of the protective circuit into the input unit inevitably causes a circuit loss. This circuit loss causes decrease in a gain in amplifiers in general, and there is a problem that the circuit loss brings degradation of noise figure characteristics particularly in low-noise amplifiers.

The present disclosure is made to solve the problem as described above and is directed to providing a semiconductor device having a circuit configuration that improves tolerance to excessive input without degrading noise figure characteristics.

Solution to Problem

A semiconductor device according to the present disclosure includes: an n-channel depletion-mode transistor including a gate terminal and a source terminal; an input matching circuit to which high-frequency power is input, which is connected to the gate terminal and a ground terminal, and inside which the gate terminal and the ground terminal are DC-connected; a self-bias circuit including a resistor having one end connected to the source terminal and the other end connected to the ground terminal and biasing the transistor by a voltage drop due to a current flowing through the resistor, and a capacitor connected in parallel to the resistor and regarded as short-circuit at a frequency of the high-frequency power; and a diode having an endmost anode connected to the source terminal and an endmost cathode connected to the ground terminal, and connected in one stage or connected in series in a plurality of stages in the same direction.

Advantageous Effects of Invention

In the present disclosure, it is possible to provide a semiconductor device capable of achieving improvement in tolerance to excessive input without degrading noise figure characteristics.

DESCRIPTION OF EMBODIMENTS

Embodiment 1

Figure 1:
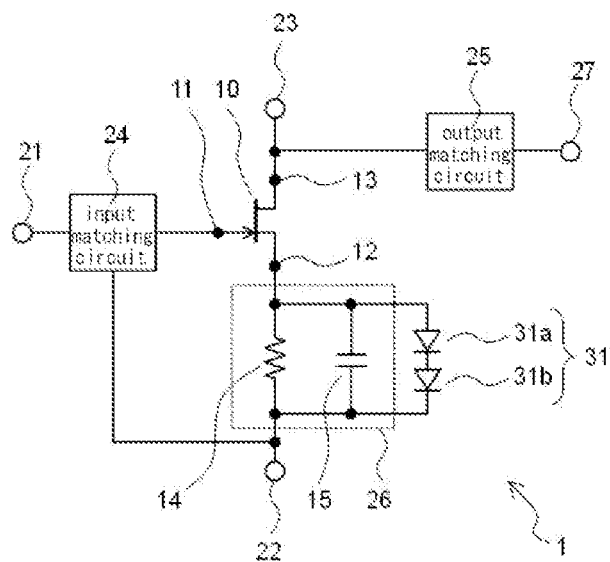
FIG. 1 is a circuit diagram illustrating a semiconductor device according to Embodiment 1.

A semiconductor device 1 in Embodiment 1 of the present disclosure will be described using FIG. 1 to FIG. 6. Note that in the drawings, components to which the same reference numerals are assigned correspond to the same or corresponding components, which holds true for the full text of the specification. Embodiments of the present disclosure will be described below with reference to the drawings.

FIG. 1 is a circuit diagram illustrating the semiconductor device 1 according to Embodiment 1.

The semiconductor device 1 in Embodiment 1 is a monolithic microwave integrated circuit (MMIC) in which circuit elements are integrated on a GaAs substrate.

The semiconductor device 1 includes a transistor 10, a resistor 14, a capacitor 15, an input matching circuit 24, an output matching circuit 25 and a diode 31. The semiconductor device 1 includes an RF power input terminal 21, a ground terminal 22, a drain voltage supply terminal 23 and an RF power output terminal 27.

The transistor 10 is an n-channel depletion-mode transistor including a gate terminal 11, a source terminal 12 and a drain terminal 13.

The gate terminal 11 of the transistor 10 is connected to the input matching circuit 24. The drain terminal 13 of the transistor is connected to the output matching circuit 25 and the drain voltage supply terminal 23. The source terminal 12 of the transistor is connected to the ground terminal 22 via the resistor 14, the capacitor 15 and the diode 31 that are connected in parallel to each other. The resistor 14 and the capacitor 15 form a self-bias circuit 26.

The input matching circuit 24 is connected to the RF power input terminal 21. The input matching circuit 24 matches the RF power input terminal 21 with the gate terminal 11 and transmits high-frequency power input from the RF power input terminal 21 to the gate terminal 11 with low loss.

The input matching circuit 24 is connected to the ground terminal 22, and the ground terminal 22 and the gate terminal 11 are DC-connected inside the input matching circuit 24. Thus, in a case where the ground terminal 22 is grounded, the input matching circuit 24 provides a ground potential to the gate terminal 11.

The output matching circuit 25 is connected to the RF power output terminal 27 and matches the drain terminal 13 with the RF power output terminal 27.

The diode 31 has a two-stage configuration in which a diode 31a and a diode 31b are connected in series in the same direction. An anode of the diode 31a which is an endmost anode is connected to the source terminal 12, and a cathode of the diode 31b which is an endmost cathode is connected to the ground terminal 22. A cathode of the diode 31a is connected to an anode of the diode 31b.

The capacitor 15 has an impedance which is sufficiently low at a frequency of high-frequency power to be input from the RF power input terminal 21 and is a value that can be regarded as short-circuit by the source terminal 12 of the transistor 10.

The ground terminal 22 is connected to a reference potential under the conditions of use of the semiconductor device 1. While in Embodiment 1, the reference potential is a ground potential of electronic equipment on which the semiconductor device 1 is mounted, the reference potential may be a constant potential that is not zero. The drain voltage supply terminal 23 is connected to an external power supply of the semiconductor device 1, which supplies a positive voltage. Note that the external power supply is not illustrated.

Assuming that a resistance value of the resistor 14 is R, and a drain current Id flows through the transistor 10 under a bias condition, a potential of the source terminal 12 of the transistor 10 rises by an amount corresponding to a voltage drop Id×R of the resistor 14 under the bias condition. Since the ground terminal 22 is grounded, a potential of the gate terminal 11 is a ground potential. Consequently, a potential difference occurs in a reverse direction between the gate and the source, and the drain current Id is thereby controlled. The resistance value R is determined in advance so that the drain current Id takes a desired current value.

The diode 31 is preferably positioned so that almost no current flows, for example, the current becomes equal to or less than one hundredth of the drain current Id under the bias condition in which high-frequency power is not input to the RF power input terminal 21 and may be connected in series in three or more stages as necessary. Alternatively, the diode 31 may be connected in one stage.

By adjusting the number of stages of the diode 31 so as to prevent a current from flowing through the diode 31, it is possible to avoid temperature dependence of a bias current of the semiconductor device 1 from being affected by temperature dependence of the diode 31. Thus, in a case where the temperature dependence of the bias current of the semiconductor device 1 is adjusted by utilizing the temperature dependence of the diode, the number of stages of the diode may be set so that a drain current flows when high-frequency power is not applied. Further, connecting the diode in a plurality of stages is also effective in a case where power at which an effect of reducing a gate-to-source potential difference in the reverse direction can be obtained is increased, which will be described later.

The effect of reducing the gate-to-source potential difference in the reverse direction is reduced with decrease in a size of the diode 31, and the effect of reducing the potential difference is enhanced with increase in the size. On the other hand, if the size of the diode 31 is increased, a forward current flowing between the gate and the source of the transistor 10 during excessive input increases, which may lead to a so-called breaking mode by the forward current between the gate and the source. Thus, the size of the diode 31 including a chip layout size of the semiconductor device 1 is appropriately selected.

In Embodiment 1, the diode 31 is integrated on the semiconductor device 1. However, for example, in a case where an operating frequency is low, the semiconductor device 1 can be constituted by connecting a diode prepared outside the semiconductor device 1, between the source terminal 12 and the ground terminal 22 without integrating the diode 31.

In this case, the diode 31 can be manufactured through a manufacturing process different from a manufacturing process of the transistor 10, so that it is possible to select and prepare a diode having characteristics optimal for a withstand power effect which is required.

FIG. 2 to FIG. 5 indicate calculation examples regarding effects of the present disclosure. FIG. 2 to FIG. 5 also indicate calculation results of a semiconductor device obtained by removing the diode 31 from the semiconductor device 1 illustrated in FIG. 1 as a comparative example.

Calculation conditions are the same between the semiconductor device 1 and the semiconductor device according to the comparative example.

The transistor 10, which is an n-channel depletion-mode FET including GaAs as a chief material, has a pinch-off voltage Vp of −0.5 V and has a total gate width of 300 um.

A resistance value R of the resistor 14 is 30Ω, and a capacitance value of the capacitor 15 is 3.3 pF.

The ground terminal 22 is grounded. A voltage of +3 V is supplied to the drain voltage supply terminal 23, and an idle current of 12 mA flows through the transistor 10. In this event, a voltage drop also occurs between the gate and the drain, and thus, a voltage to be applied between the drain terminal 13 and the source terminal 12 of the transistor 10 is approximately 2.0 V.

The diodes 31a and 31b, which are Schottky gate diodes, have a diode size of 40 um and have an ON voltage of the diode of 0.7 V.

A frequency of a high frequency of 5 GHz is input to the semiconductor device 1 and the semiconductor device according to the comparative example. Each of the RF power input terminal 21 and the RF power output terminal 27 is terminated at 50Ω.

Gains of the semiconductor device 1 and the semiconductor device according to the comparative example at 5 GHz are approximately 10 dB, output power upon gain compression of 1 dB (P1 dB) is approximately 0 dBm, and saturated output power is approximately 10 dBm.

Figure 2:
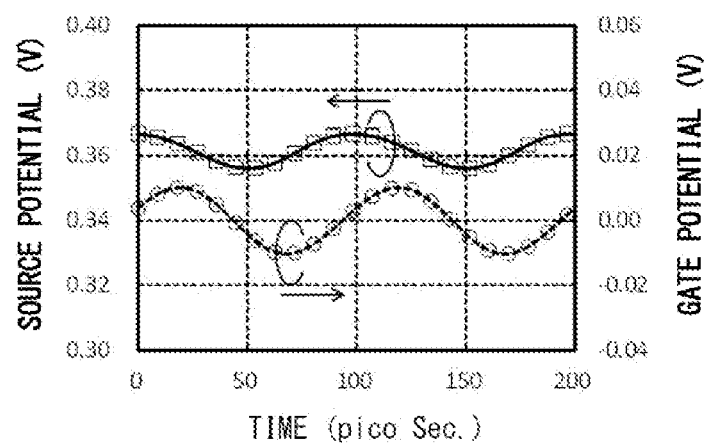
FIG. 2 is a view indicating calculation results of a potential of the gate terminal 11 and a potential of the source terminal 12 of the semiconductor device 1 according to Embodiment 1.

FIG. 2 is a view indicating calculation results of a potential of the gate terminal 11 and a potential of the source terminal 12 of the semiconductor device 1 according to Embodiment 1. FIG. 2 indicates the potential of the gate terminal 11 of the semiconductor device 1 with a dotted line and the potential of the source terminal 12 with a solid line in a case where high-frequency power of −30 dBm is input to the RF power input terminal 21. FIG. 2 indicates time on a horizontal axis, the potential of the source terminal 12 on a left vertical axis and the potential of the gate terminal 11 on a right vertical axis.

Further, FIG. 2 also indicates calculation results of the potential of the gate terminal 11 of the semiconductor device according to the comparative example with circles and calculation results of the potential of the source terminal 12 with squares.

In FIG. 2, the potential (dotted line) of the gate terminal 11 of the semiconductor device 1 overlaps with the potential (circles) of the gate terminal 11 of the semiconductor device according to the comparative example. Further, the potential (solid line) of the source terminal 12 of the semiconductor device 1 overlaps with the potential (squares) of the source terminal 12 of the semiconductor device according to the comparative example. In other words, there is no difference in a gate-to-source potential difference Vgs between the semiconductor device 1 and the semiconductor device according to the comparative example. If the potential of the gate terminal 11 rises, the potential of the source terminal 12 also rises, and phases of behavior of the potentials of the gate terminal 11 and the source terminal 12 are substantially the same.

Figure 3:
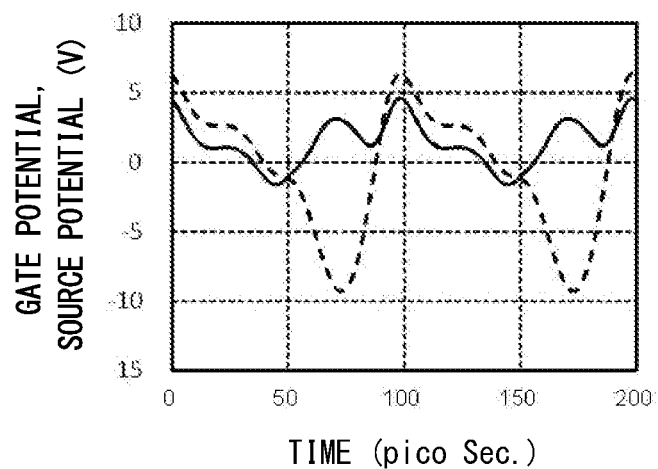
FIG. 3 is a view indicating calculation results of a potential of the gate terminal 11 and a potential of the source terminal 12 of the semiconductor device 1 according to Embodiment 1.
Figure 4:
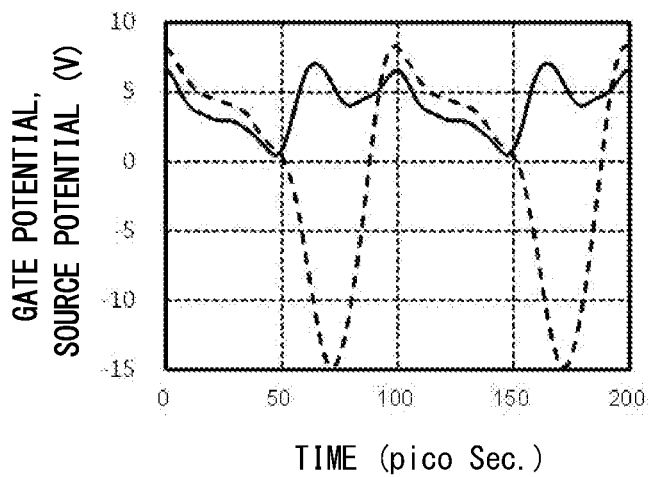
FIG. 4 is a view indicating calculation results of the potential of the gate terminal 11 and the potential of the source terminal 12 of the semiconductor device according to the comparative example.

Calculation results in a case where excessive power is input to the semiconductor device 1 and the semiconductor device according to the comparative example will be described next. FIG. 3 is a view indicating calculation results of the potential of the gate terminal 11 and the potential of the source terminal 12 of the semiconductor device 1 according to Embodiment 1. FIG. 4 is a view indicating calculation results of the potential of the gate terminal 11 and the potential of the source terminal 12 of the semiconductor device according to the comparative example.

FIG. 3 and FIG. 4 indicate calculation results in a case where high-frequency power of +30 dBm that exceeds the saturated output power (approximately 10 dBm) by approximately 20 dBm is input to the RF power input terminals 21 of the semiconductor device 1 and the semiconductor device according to the comparative example assuming excessive input.

FIG. 3 and FIG. 4 indicate the potential of the gate terminal 11 with a dotted line and indicate the potential of the source terminal 12 with a solid line. FIG. 3 and FIG. 4 indicate time on a horizontal axis and indicate the potentials of the gate terminal 11 and the source terminal 12 on a vertical axis.

As illustrated in FIG. 4, at the semiconductor device according to the comparative example, the gate-to-source potential difference Vgs at time 70.5 picoseconds indicates −20.7 V which is a maximum value in the reverse direction. In this event, the potential of the gate terminal 11 is −14.7 V, and the potential of the source terminal 12 is 6.0 V.

In this manner, in a state where excessive high-frequency power is input to the semiconductor device, and the gate-to-source potential difference in the reverse direction becomes great, phase shift occurs in behavior of the potentials of the gate terminal 11 and the source terminal 12, which brings about a situation where the gate terminal 11 becomes a great negative voltage, and the source terminal 12 becomes a great positive voltage.

On the other hand, as illustrated in FIG. 3, at the semiconductor device 1, the gate-to-source potential difference Vgs at time 72.3 picoseconds indicates −12.4 V which is a maximum value in the reverse direction. In this event, the potential of the gate terminal 11 is −9.3 V, and the potential of the source terminal 12 is 3.1 V.

In other words, compared to the semiconductor device according to the comparative example, at the semiconductor device 1 in the present disclosure, a maximum value of the gate-to-source potential difference Vgs in the reverse direction decreases.

Figure 5:
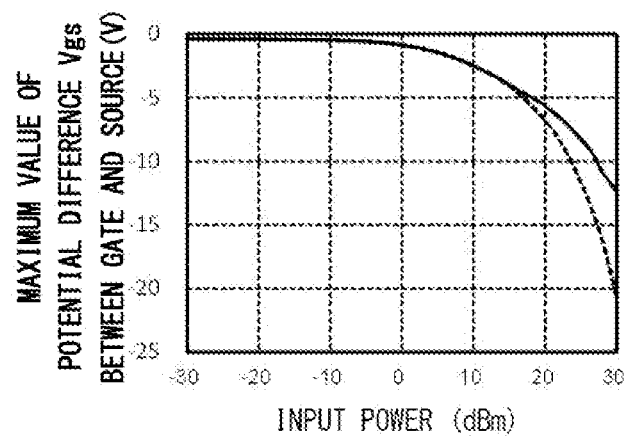
FIG. 5 is a view indicating input power dependence of the maximum value in the reverse direction of the gate-to-source potential difference in the semiconductor device 1 according to Embodiment 1.

FIG. 5 is a view indicating input power dependence of the maximum value in the reverse direction of the gate-to-source potential difference in the semiconductor device 1 according to Embodiment 1.

FIG. 5 indicates a power value of high-frequency power to be input to the semiconductor device 1 on a horizontal axis and indicates a maximum value in the reverse direction of the gate-to-source potential difference Vgs on a vertical axis.

FIG. 5 indicates a maximum value in the reverse direction of the gate-to-source potential difference Vgs at the semiconductor device 1 according to Embodiment 1 with a solid line. FIG. 5 also indicates a maximum value in the reverse direction of the gate-to-source potential difference Vgs at the semiconductor device according to the comparative example with a dotted line.

As illustrated in FIG. 5, at both the semiconductor device 1 and the semiconductor device according to the comparative example, the gate-to-source potential difference Vgs in the reverse direction increases in accordance with increase in input power.

However, as a result of the diode 31 being connected to the self-bias circuit 26 in parallel, in a case where input power is equal to or greater than 14 dBm, the gate-to-source potential difference Vgs in the reverse direction decreases at the semiconductor device 1 according to Embodiment 1 compared to the semiconductor device according to the comparative example.

In other words, the semiconductor device 1 according to Embodiment 1 provides an effect of reducing a possibility of breakage for excessive input power. Here, the diode 31 is positioned between the source terminal 12 and the ground terminal 22. Thus, a loss of the input matching circuit 24 does not increase, and noise figure characteristics do not degrade due to the diode 31 being provided at the semiconductor device 1.

As described above, the semiconductor device 1 in Embodiment 1 of the present disclosure includes the n-channel depletion-mode transistor 10 including the gate terminal 11 and the source terminal 12, the input matching circuit 24 to which high-frequency power is input and which is connected to the gate terminal 11 and the ground terminal 22 and which DC connects the gate terminal 11 and the ground terminal 22, the self-bias circuit 26 that includes the resistor 14 that has one end connected to the source terminal 12 and the other end connected to the ground terminal 22 and biases the transistor 10 by a voltage drop due to a current flowing through the resistor 14 and the capacitor 15 that is connected in parallel to the resistor 14 and can be regarded as short-circuit at a frequency of the high-frequency power, and the diode 31 whose endmost anode is connected to the source terminal 12 and whose endmost cathode is connected to the ground terminal 22 and which is connected in two stages in series in the same direction.

With such a configuration, in a case where excessive high-frequency power is input, it is possible to reduce the gate-to-source potential difference Vgs in the reverse direction without increasing a loss at the input matching circuit 24. It is therefore possible to provide an effect of achieving improvement in tolerance to excessive input without degrading noise figure characteristics.

Note that the semiconductor device 1 in Embodiment 1 is an amplifier circuit in one stage. In a case where a desired amplifier circuit is a multistage amplifier, the effect can be obtained by providing the proposed circuit of the present disclosure for protecting from excessive input only in the forefront stage. This is because the second stage and the subsequent stages are designed typically to specifications that provide tolerance to input power of the preceding stage. However, the proposed circuit of the present disclosure has no effect on high-frequency characteristics, and thus, can be applied to the subsequent stages as well as the forefront stage, which may cause no problem.

Embodiment 2

Embodiment 2 will be described. A semiconductor device 2 is different from the semiconductor device 1 in that while the diode 31 and the self-bias circuit 26 are connected in parallel in the semiconductor device 1, the diode 31 and a resistor 32 connected in series, and the self-bias circuit 26 are connected in parallel in the semiconductor device 2. The semiconductor device 2 is the same as the semiconductor device 1 in other points.

Figure 6:
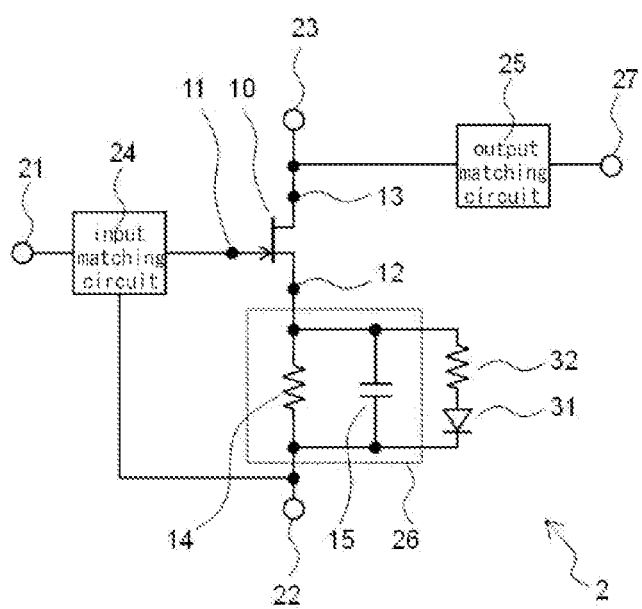
FIG. 6 is a circuit diagram illustrating a semiconductor device 2 according to Embodiment 2 of the present disclosure.

FIG. 6 is a circuit diagram illustrating the semiconductor device 2 according to Embodiment 2 of the present disclosure.

As illustrated in FIG. 6, one end of the resistor 32 is connected to the source terminal 12, the other end of the resistor 32 is connected to the anode of the diode 31, and the cathode of the diode 31 is connected to the ground terminal 22.

Note that concerning a connection relationship of the diode 31 and the resistor 32, the resistor 32 may be connected on the cathode side of the diode 31. In other words, the diode 31 is only required to be connected to the source terminal 12 or the ground terminal 22 via the resistor 32. While FIG. 6 illustrates the diode 31 in one stage, diode 31 may be connected in series in a plurality of stages in the same direction.

Embodiment 2 provides an effect of achieving improvement in tolerance to excessive input without degrading noise figure characteristics in a similar manner to Embodiment 1.

Further, while in Embodiment 1, a size of the diode 31 is limited due to trade-off of the effect of reducing the potential difference in the reverse direction and the effect of reducing the forward current, in Embodiment 2, the forward current is reduced by the resistor 32 connected in series to the diode 31.

Thus, Embodiment 2 provides an effect of enabling, in a case where a diode of a larger size is required due to withstand power characteristics of the diode 31, the resistor 32 to prevent the transistor 10 that is intended to be protected from being broken due to the forward current.

Description of other points will be omitted.

Embodiment 3

Embodiment 3 will be described. In the semiconductor device 1, the diode 31 is connected in parallel to the self-bias circuit 26. On the other hand, in a semiconductor device 3, a protective circuit 29 including three sets of diodes and switches connected in series are connected in parallel to the self-bias circuit 26. The semiconductor device 3 is different from the semiconductor device 1 in this point. The semiconductor device 3 is the same as the semiconductor device 1 in other points.

Figure 7:
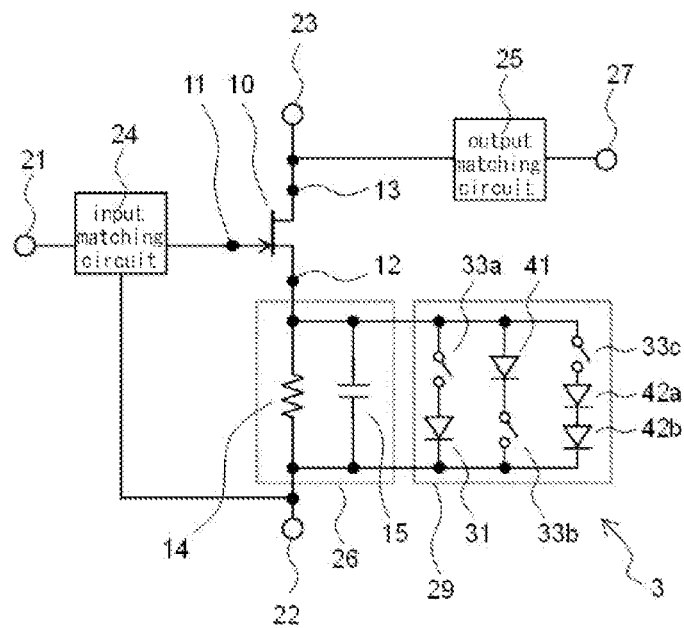
FIG. 7 is a circuit diagram illustrating a semiconductor device 3 according to Embodiment 3 of the present disclosure.

FIG. 7 is a circuit diagram illustrating the semiconductor device 3 according to Embodiment 3 of the present disclosure.

The diode 31 and a switch 33a, a diode 41 and a switch 33b, and diodes 42a and 42b and a switch 33c each constitutes a set. These three sets of diodes and switches constitute the protective circuit 29.

In the set of the diode 31 and the switch 33a, one end of the switch 33a is connected to the source terminal 12, and the other end is connected to the anode of the diode 31. The cathode of the diode 31 is connected to the ground terminal 22.

On the other hand, in the set of the diode 41 and the switch 33b, one end of the switch 33b is connected to the ground terminal 22, and the other end is connected to a cathode of the diode 41. An anode of the diode 41 is connected to the source terminal 12.

Further, in the set of the diodes 42a and 42b and the switch 33c, one end of the switch 33c is connected to the source terminal 12, and the other end is connected to an anode of the diode 42a. Further, a cathode of the diode 42a is connected to an anode of the diode 42b, and a cathode of the diode 42b is connected to the ground terminal 22.

If the end on the anode side of the diode in each set is connected to the source terminal 12, and the end on the cathode side is connected to the ground terminal 22 in this manner, the diode and the switch in each set may be connected in any order. Further, the diode in each set may be either a diode in one stage as the diodes 31 and 41 or diodes connected in series in two stages in the same direction as the diodes 42a and 42b or may be connected in series in the same direction in more stages.

Embodiment 3 configured as described above also provides an effect of achieving improvement in tolerance to excessive input without degrading noise figure characteristics in a similar manner to Embodiment 1.

Further, in Embodiment 3, the diodes 31, 41 and 42a and 42b to which switches are connected are connected in parallel to the self-bias circuit 26. This provides an effect of being able to switch a withstand power effect which is required by switching connection by the switches.

Further, by using diodes having different characteristics and different sizes as the diodes 31, 41 and 42a and 42b or externally providing the diodes 31, 41 and 42a and 42b, it is possible to select and prepare a diode optimal for the withstand power effect which is required. Further, in a case where the frequency is relatively high, and characteristics are affected by externally providing the diodes, it is also possible to integrate the diodes in advance and use the diode by switching the switches as necessary.

Note that while FIG. 7 illustrates an example where a circuit in which diodes of one or more stages and the switch are connected in series is connected in parallel to the self-bias circuit 26, it is also possible to switch the withstand power effect in a similar manner even if a circuit in which the resistor, the diode and the switch are connected in series as described in Embodiment 2 is positioned in parallel to the self-bias circuit 26.

Description of other portions will be omitted.

Embodiment 4

Embodiment 4 will be described. A semiconductor device 4 according to Embodiment 4 includes an enhancement-mode transistor 16 in place of the depletion-mode transistor 10.

In a case where the depletion-mode transistor that requires a negative bias is used only at a positive voltage, the self-bias circuit utilizing a voltage drop is required as in Embodiment 1. In contrast, the enhancement-mode transistor, which can control a drain current flowing through the transistor with a positive gate bias, is easy to be used in application in, for example, a mobile terminal, and the like.

A self-bias in which the resistor is connected between the source and the ground, and a bias is applied by utilizing a voltage drop by a current flowing through the resistor is not typically employed in the enhancement-mode transistor, and generally, the enhancement-mode transistor is directly grounded.

As described above, insertion of the protective circuit into the input unit inevitably causes a circuit loss and causes decrease in a gain in general amplifiers. In particular, in low-noise amplifiers, there is a problem that the circuit loss brings degradation of noise figure characteristics. However, in a case where the protective circuit is not inserted into the input unit, there is a possibility that breakage may occur due to the forward current for excessive input to the transistor.

Thus, in Embodiment 4, by connecting a resistor 20, the capacitor 15 and the diode 31 that are connected in parallel, to a source terminal 18 of the enhancement-mode transistor 16, the transistor 16 is protected from excessive input.

Figure 8:
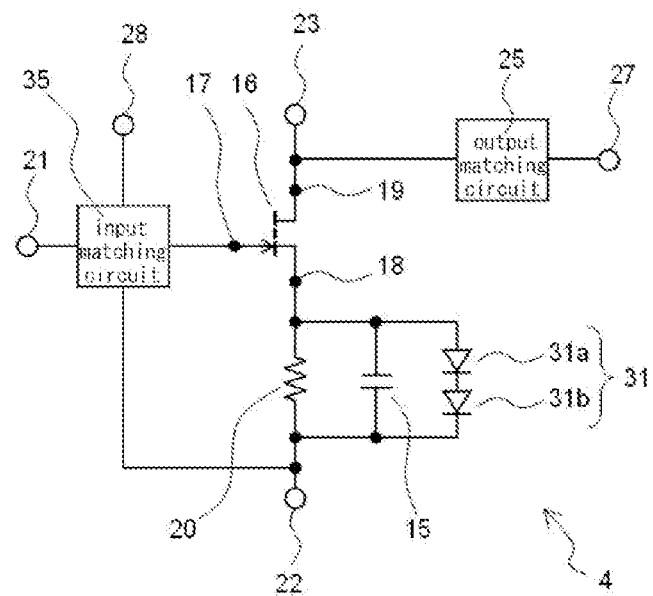
FIG. 8 is a circuit diagram illustrating a semiconductor device 4 according to Embodiment 4 of the present disclosure.

FIG. 8 is a circuit diagram illustrating the semiconductor device 4 according to Embodiment 4 of the present disclosure.

The semiconductor device 4 includes the transistor 16, the resistor 20, the capacitor 15, an input matching circuit 35, the output matching circuit 25 and the diode 31. Further, the semiconductor device 4 includes the RF power input terminal 21, the ground terminal 22, the drain voltage supply terminal 23, the RF power output terminal 27 and a gate voltage supply terminal 28. In other words, the semiconductor device 4 is different from the semiconductor device 1 in that the semiconductor device 4 includes the transistor 16, the resistor 20, the gate voltage supply terminal 28 and the input matching circuit 35.

The transistor 16 is an n-channel enhancement-mode transistor including a gate terminal 17, the source terminal 18 and a drain terminal 19.

The gate terminal 17 is connected to the input matching circuit 35, and the input matching circuit 35 is connected to the RF power input terminal 21, the ground terminal 22 and the gate voltage supply terminal 28.

The input matching circuit 35 matches the RF power input terminal 21 with the gate terminal 17 and transmits high-frequency power input from the RF power input terminal 21 to the gate terminal 17 with low loss.

The gate terminal 17 is DC connected to the gate voltage supply terminal 28 inside the input matching circuit 35. In Embodiment 4, the gate terminal 17 and the ground terminal 22 are not DC connected.

The drain terminal 19 of the transistor is connected to the output matching circuit 25 and the drain voltage supply terminal 23.

The output matching circuit 25, which is connected to the RF power output terminal 27, matches the drain terminal 19 with the RF power output terminal 27.

The source terminal 18 of the transistor is connected to the ground terminal 22 via the resistor 20, the capacitor 15 and the diode 31 that are connected in parallel to each other.

The diode 31 has a two-stage configuration in which the diode 31a and the diode 31b are connected in series in the same direction. The anode of the diode 31a which is an endmost anode is connected to the source terminal 18, and the cathode of the diode 31b which is an endmost cathode is connected to the ground terminal 22. The cathode of the diode 31a is connected to the anode of the diode 31b.

The capacitor 15 has an impedance which is sufficiently low at a frequency of high-frequency power to be input from the RF power input terminal 21 and has a value that can be regarded as short-circuit by the source terminal 18 of the transistor 16.

The ground terminal 22 is connected to a reference potential under the conditions of use of the semiconductor device 4. While in Embodiment 4, the reference potential is a ground potential of electronic equipment that includes the semiconductor device 4, the reference potential may be a constant potential that is not zero.

The drain voltage supply terminal 23 is connected to an external power supply of the semiconductor device 4, which supplies a positive voltage. Note that the external power supply is not illustrated.

The gate voltage supply terminal 28 is connected to the external power supply (not illustrated) of the semiconductor device 4, which supplies a positive voltage under conditions of use of the semiconductor device 4. The gate terminal 17 is DC connected to the gate voltage supply terminal 28 inside the input matching circuit 35, and thus, a gate bias voltage is supplied to the gate terminal 17.

In Embodiment 4, the drain current of the transistor 16 can be controlled by the gate bias voltage, and thus, a resistance value R of the resistor 20 in Embodiment 4 has a higher degree of freedom than the resistance value of the resistor 14 in Embodiment 1, which allows the resistance value R to be determined on the basis of the withstand power effect.

As described above, the semiconductor device 4 according to Embodiment 4 includes the n-channel enhancement-mode transistor 16 including the gate terminal 17 and the source terminal 18, the input matching circuit 35 to which high-frequency power is input and which is connected to the gate terminal 17 and the gate voltage supply terminal 28 and which DC connects the gate terminal 17 and the gate voltage supply terminal 28, the capacitor 15 that is connected to the source terminal 18 and the ground terminal 22 and can be regarded as short-circuit at a frequency of the high-frequency power to be input to the gate terminal 17, the resistor 20 connected in parallel to the capacitor 15, and the diode 31 whose endmost anode is connected to the source terminal 18 and whose endmost cathode is connected to the ground terminal 22 and which is connected in series in two stages in the same direction.

With such a configuration, in a case where excessive high-frequency power is input, it is possible to reduce the gate-to-source potential difference Vgs in the reverse direction without increasing a loss of the input matching circuit 35. It is therefore possible to provide an effect of achieving improvement in tolerance to excessive input without degrading noise figure characteristics.

Figure 9:
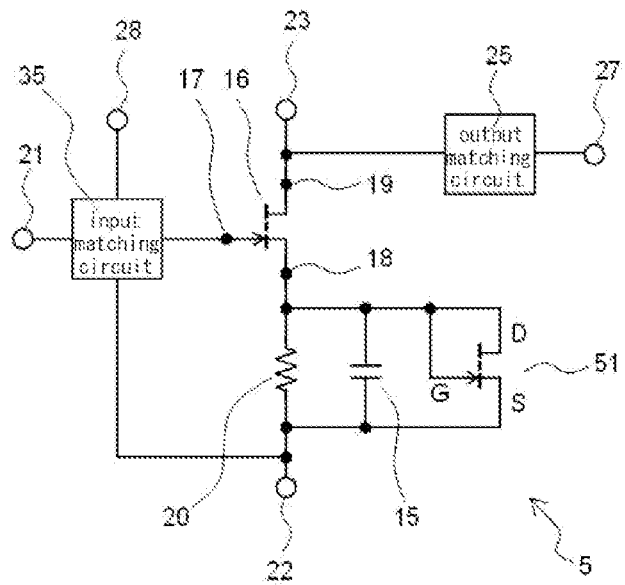
FIG. 9 is a circuit diagram illustrating a semiconductor device 5 according to a modification of Embodiment 4 of the present disclosure.

FIG. 9 is a circuit diagram illustrating a semiconductor device 5 according to a modification of Embodiment 4 of the present disclosure.

The semiconductor device 5 includes an n-channel enhancement-mode transistor 51 in which a gate terminal and a drain terminal are connected in place of the diode 31 in the semiconductor device 4. The gate terminal and the drain terminal of the transistor 51 are connected to the source terminal 18, and a source terminal of the transistor 51 is connected to the ground terminal 22.

The enhancement-mode transistor 51 in which the gate terminal and the drain terminal are connected exhibits rectification characteristics of rising at a positive threshold voltage in a similar manner to the diode. Thus, the semiconductor device 5 according to the modification provides an effect of achieving improvement in tolerance to excessive input without degrading noise figure characteristics.

A rising voltage of a Schottky barrier diode that is commonly used as a compound semiconductor diode depends on a Schottky barrier φB of a metal and a semiconductor that constitute the diode, and thus, it is difficult to largely change the rising voltage and it is also difficult to manufacture different diode characteristics in the same semiconductor process.

On the other hand, a rising voltage of an enhancement-mode transistor in which a gate terminal and a drain terminal are connected can be controlled to some extent by the semiconductor process. Thus, the semiconductor device 5 that is the modification of Embodiment 4 provides an effect that it is easy to obtain a desired withstand power effect.

Further, the rising voltage of the Schottky barrier diode is different from the rising voltage of the enhancement-mode transistor in which the gate terminal and the drain terminal are connected, and thus, combination of both provides an effect of further increasing a degree of freedom of control of the withstand power effect.

Description of other portions will be omitted.

Embodiment 5

Embodiment 5 will be described.

Figure 10:
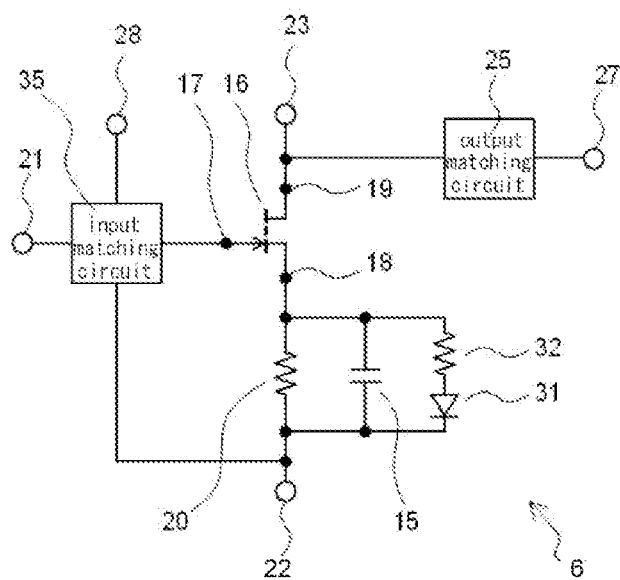
FIG. 10 is a circuit diagram illustrating a semiconductor device 6 according to Embodiment 5 of the present disclosure.

FIG. 10 is a circuit diagram illustrating a semiconductor device 6 according to Embodiment 5 of the present disclosure.

The semiconductor device 6 is different from the semiconductor device 5 in the following points. In the semiconductor device 5, the diode 31 is connected in parallel to the resistor 20 and the capacitor 15 that are connected in parallel and is connected between the source terminal 18 and the ground terminal 22. On the other hand, in the semiconductor device 6, the diode 31 and the resistor 32 connected in series are connected in parallel to the resistor 20 and the capacitor 15 that are connected in parallel and are connected between the source terminal 18 and the ground terminal 22. The semiconductor device 6 is the same as the semiconductor device 5 in other points.

As illustrated in FIG. 10, one end of the resistor 32 is connected to the source terminal 18, the other end of the resistor 32 is connected to the anode of the diode 31, and the cathode of the diode 31 is connected to the ground terminal 22. Concerning a connection relationship of the diode 31 and the resistor 32, the resistor 32 may be connected on the cathode side of the diode 31. In other words, the diode 31 is only required to be connected to the source terminal 12 or the ground terminal 22 via the resistor 32. While the diode 31 in FIG. 10 is a diode in one stage, the diode 31 may be diodes connected in series in a plurality of stages in the same direction.

In Embodiment 4, a size of the diode 31 is limited by trade-off of the effect of reducing the potential difference in the reverse direction and the effect of reducing the forward current. In contrast, in Embodiment 5, the forward current is reduced by the resistor 32 connected in series to the diode 31.

Thus, Embodiment 5 provides an effect of achieving improvement in tolerance to excessive input without degrading noise figure characteristics in a similar manner to Embodiment 4. Further, Embodiment 5 provides an effect that, in a case where a diode of a larger size is required for withstand power characteristics of the diode 31, the resistor 32 can prevent the transistor 16 that is intended to be protected from being broken by the forward current.

Description of other portions will be omitted.

Embodiment 6

Embodiment 6 will be described.

Figure 11:
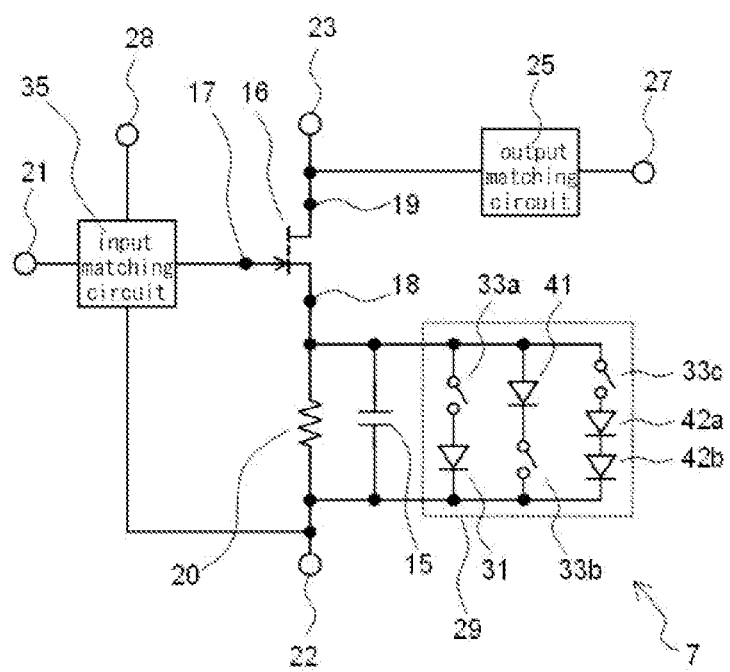
FIG. 11 is a circuit diagram illustrating a semiconductor device 7 according to Embodiment 6 of the present disclosure.

In the semiconductor device 4, the diode 31 is connected in parallel to the resistor 20 and the capacitor 15 that are connected in parallel. On the other hand, as illustrated in FIG. 11, in a semiconductor device 7, the protective circuit 29 including three sets of diodes and switches that are connected in series are connected in parallel to the resistor 20 and the capacitor 15 that are connected in parallel. The semiconductor device 7 is different from the semiconductor device 4 in this point. The semiconductor device 7 is the same as the semiconductor device 4 in other points.

FIG. 11 is a circuit diagram illustrating the semiconductor device 7 according to Embodiment 6 of the present disclosure.

The diode 31 and the switch 33a, the diode 41 and the switch 33b and the diodes 42a and 42b and the switch 33c each constitutes a set. These three sets of the diodes and the switches constitute the protective circuit 29.

In the set of the diode 31 and the switch 33a, one end of the switch 33a is connected to the source terminal 18, and the other end is connected to the anode of the diode 31. The cathode of the diode 31 is connected to the ground terminal 22.

On the other hand, in the set of the diode 41 and the switch 33b, one end of the switch 33b is connected to the ground terminal 22, and the other end is connected to the cathode of the diode 41. The anode of the diode 41 is connected to the source terminal 18.

Further, in the set of the diodes 42a and 42b and the switch 33c, one end of the switch 33c is connected to the source terminal 18, and the other end is connected to the anode of the diode 42a. Further, the cathode of the diode 42a is connected to the anode of the diode 42b, and the cathode of the diode 42b is connected to the ground terminal 22.

If the end on the anode side of the diode in each set is connected to the source terminal 18, and the end on the cathode side is connected to the ground terminal 22 in this manner, the diode and the switch in each set may be connected in any order. Further, the diode in each set may be either a diode in one stage as the diodes 31 and 41 or diodes connected in series in two stages in the same direction as the diodes 42a and 42b or may be connected in series in the same direction in more stages.

Embodiment 6 configured as described above also provides an effect of achieving improvement in tolerance to excessive input without degrading noise figure characteristics in a similar manner to Embodiment 4.

Further, in Embodiment 6, the diodes 31, 41 and 42a and 42b to which the switches are connected are connected in parallel to the resistor 20 and the capacitor 15 that are connected in parallel. By switching connection by the switches, it is possible to provide an effect of being able to switch the withstand power effect which is required.

Further, by using diodes having different characteristics and different sizes as the diodes 31, 41 and 42a and 42b or externally providing the diodes 31, 41 and 42a and 42b, it is possible to select and prepare a diode optimal for the withstand power effect which is required. Further, in a case where the frequency is relatively high, and characteristics are affected by externally providing the diodes, it is also possible to integrate the diodes in advance and use the diode by switching the switches as necessary.

Note that while FIG. 11 illustrates an example where a circuit in which the diodes in one or more stages and the switch are connected in series is connected in parallel to the resistor 20 and the capacitor 15 that are connected in parallel, it is possible to switch the withstand power effect in a similar manner even if a circuit in which the resistor, the diode and the switch are connected in series as described in Embodiment 5 is positioned in parallel to the resistor 20 and the capacitor 15 that are connected in parallel.

Description of other portions will be omitted.

The semiconductor device in the present disclosure described above in Embodiment 1 to Embodiment 6 excels in power transmission at a high frequency and neither increases a loss of the input matching circuit nor causes degradation of noise figure characteristics, and thus, is suitable for, particularly, a high-frequency semiconductor device, more particularly, a low-noise amplifier.

Note that while the semiconductor device in the present disclosure is an MMIC, the semiconductor device may have a so-called discrete configuration in which the transistor and other circuits are not unified. A material of the semiconductor may be, for example, gallium nitride or silicon instead of GaAs. While the diode is a Schottky diode, the diode may be, for example, a pn junction diode.

Note that the present disclosure is not limited to the above-described embodiments and includes various modifications. For example, the above-described embodiments are provided to describe the present disclosure in detail to facilitate understanding and do not necessarily limit the present disclosure to that including all the described components. Further, part of the configuration of one embodiment can be replaced with a configuration of other embodiments, and the configuration of other embodiments can also be added to the configuration of one embodiment. Still further, other configurations can be also added to, deleted from and substituted for part of the configuration of each embodiment.

REFERENCE SIGNS LIST 1 to 7 semiconductor device
10,16 transistor
11,17 gate terminal
12,18 source terminal
13,19 drain terminal
14,20,32 resistor
15 capacitor
21 RF power input terminal
22 ground terminal
23 drain voltage supply terminal
24,35 input matching circuit
25 output matching circuit
26 self-bias circuit
27 RF power output terminal
28 gate voltage supply terminal
29 protective circuit
31,41,42a,42b diode
33a,33b,33c switch

The invention claimed is:

1. A semiconductor device comprising:
an n-channel depletion-mode transistor including a gate terminal and a source terminal;
an input matching circuit to which high-frequency power is input, which is connected to the gate terminal and a ground terminal, and inside which the gate terminal and the ground terminal are DC-connected;
a self-bias circuit including a resistor having one end connected to the source terminal and the other end connected to the ground terminal and biasing the transistor by a voltage drop due to a current flowing through the resistor, and a capacitor connected in parallel with the resistor, the capacitor functioning as a short-circuit at a frequency of the high-frequency power; and
a diode having an endmost anode connected to the source terminal and an endmost cathode connected to the ground terminal, and connected in series in a plurality of stages in the same direction.

2. The semiconductor device according to claim 1, wherein the gate terminal and the ground terminal are DC-connected inside the input matching circuit such that the input matching circuit provides a ground potential to the gate terminal.

3. A semiconductor device comprising:
an n-channel depletion-mode transistor including a gate terminal and a source terminal;

an input matching circuit to which high-frequency power is input, which is connected to the gate terminal and a ground terminal, and inside which the gate terminal and the ground terminal are DC-connected;

a self-bias circuit including a resistor having one end connected to the source terminal and the other end connected to the ground terminal and biasing the transistor by a voltage drop due to a current flowing through the resistor, and a capacitor connected in parallel with the resistor, the capacitor functioning as a short-circuit at a frequency of the high-frequency power; and a diode having an endmost anode connected to the source terminal and an endmost cathode connected to the ground terminal, and connected in one stage or connected in series in a plurality of stages in the same direction, wherein the diode is connected to the source terminal or the ground terminal via another resistor.

4. The semiconductor device according to claim 3, wherein at least one of the stages of the diode is an n-channel enhancement-mode transistor in which a gate terminal and a drain terminal are connected.

5. A semiconductor device comprising:

an n-channel depletion-mode transistor including a gate terminal and a source terminal;

an input matching circuit to which high-frequency power is input, which is connected to the gate terminal and a ground terminal, and inside which the gate terminal and the ground terminal are DC-connected;

a self-bias circuit including a resistor having one end connected to the source terminal and the other end connected to the ground terminal and biasing the transistor by a voltage drop due to a current flowing through the resistor, and a capacitor connected in parallel with the resistor, the capacitor functioning as short-circuit at a frequency of the high-frequency power; and a protective circuit including a plurality of sets, each set including a diode in one stage or connected in a plurality of stages in the same direction and a switch connected in series with the diode, the diode having an anode side end connected to the source terminal and a cathode side end connected to the ground terminal.

6. The semiconductor device according to claim 5, wherein at least one of the sets includes another resistor, which is connected in series with the switch and the diode.

7. The semiconductor device according to claim 5, wherein at least one of the stages of the diode is an n-channel enhancement-mode transistor in which a gate terminal and a drain terminal are connected.

8. The semiconductor device according to claim 6, wherein at least one of the stages of the diode is an n-channel enhancement-mode transistor in which a gate terminal and a drain terminal are connected.

9. A semiconductor device comprising:

an n-channel enhancement-mode transistor including a gate terminal and a source terminal;

an input matching circuit to which high-frequency power is input, which is connected to the gate terminal and a gate voltage supply terminal, and inside which the gate terminal and the gate voltage supply terminal are DC-connected;

a capacitor connected to the source terminal and a ground terminal, the capacitor functioning as short-circuit at a frequency of the high-frequency power;

a resistor connected in parallel with the capacitor; and a diode having an endmost anode connected to the source terminal and an endmost cathode connected to the ground terminal, and connected in one stage or connected in series in a plurality of stages in the same direction.

10. The semiconductor device according to claim 9, wherein the diode is connected to the source terminal or the ground terminal via another resistor.

11. The semiconductor device according to claim 9, wherein at least one of the stages of the diode is another n-channel enhancement-mode transistor in which a gate terminal and a drain terminal are connected.

12. The semiconductor device according to claim 10, wherein at least one of the stages of the diode is another n-channel enhancement-mode transistor in which a gate terminal and a drain terminal are connected.

13. The semiconductor device according to claim 9, wherein the gate voltage supply terminal is configured to supply a DC voltage to the gate terminal to bias the gate terminal from the ground terminal, and the gate terminal is DC-connected to the gate voltage supply terminal via the input matching circuit.

14. The semiconductor device according to claim 9, wherein the diode is connected in series in the plurality of stages in the same direction.

15. A semiconductor device comprising:

an n-channel depletion-mode transistor including a gate terminal and a source terminal;

an input matching circuit to which high-frequency power is input, which is connected to the gate terminal and a ground terminal, and inside which the gate terminal and the ground terminal are DC-connected;

a self-bias circuit including a resistor having one end connected to the source terminal and the other end connected to the ground terminal and biasing the transistor by a voltage drop due to a current flowing through the resistor, and a capacitor connected in parallel with the resistor, the capacitor functioning as a short-circuit at a frequency of the high-frequency power; and a diode having an endmost anode connected to the source terminal and an endmost cathode connected to the ground terminal, and connected in one stage or connected in series in a plurality of stages in the same direction, wherein at least one of the stages of the diode is an n-channel enhancement-mode transistor in which a gate terminal and a drain terminal are connected.

* * * * *